(12) United States Patent
Cho et al.

(10) Patent No.: US 8,651,021 B2
(45) Date of Patent: Feb. 18, 2014

(54) ROLL PRINTING APPARATUS

(75) Inventors: Jung Woo Cho, Hwaseong-si (KR); Dae Jung Kim, Seoul (KR); Dong Min Kim, Suwon-si (KR); Sin Kwon, Suwon-si (KR); Jung Woo Seo, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 121 days.

(21) Appl. No.: 13/303,305

(22) Filed: Nov. 23, 2011

(65) Prior Publication Data
US 2012/0125215 A1 May 24, 2012

(30) Foreign Application Priority Data
Nov. 24, 2010 (KR) .................. 10-2010-0117423

(51) Int. Cl.
*B41F 35/00* (2006.01)
(52) U.S. Cl.
USPC .................................. 101/425; 101/423
(58) Field of Classification Search
USPC ........................................ 101/425
See application file for complete search history.

(56) References Cited

U.S. PATENT DOCUMENTS

| | | | | |
|---|---|---|---|---|
| 6,957,607 B2 * | 10/2005 | Biagiotti | ....................... | 101/424 |
| 7,428,868 B2 * | 9/2008 | Petri | ............................. | 101/425 |
| 7,430,962 B2 * | 10/2008 | Kim et al. | .................. | 101/389.1 |
| 7,536,954 B2 * | 5/2009 | Yoo et al. | ................... | 101/424.1 |
| 7,765,929 B2 * | 8/2010 | Kim et al. | ..................... | 101/483 |
| 7,987,782 B2 * | 8/2011 | Kim et al. | ..................... | 101/217 |
| 2003/0205157 A1 * | 11/2003 | Boatman et al. | ............. | 101/425 |
| 2005/0223926 A1 * | 10/2005 | Baeten | ......................... | 101/425 |
| 2006/0266242 A1 * | 11/2006 | Bartesaghi et al. | .......... | 101/425 |
| 2007/0051257 A1 * | 3/2007 | Heo et al. | ...................... | 101/170 |
| 2007/0181024 A1 * | 8/2007 | Tabuchi et al. | ............. | 101/401.1 |
| 2008/0000374 A1 * | 1/2008 | Kim et al. | ..................... | 101/425 |

FOREIGN PATENT DOCUMENTS

| | | |
|---|---|---|
| JP | 2007-182052 | 7/2007 |
| KR | 10-2006-0090006 | 8/2006 |
| KR | 20090003883 A | 1/2009 |

OTHER PUBLICATIONS

Korean Office Action dated Aug. 2, 2012.

* cited by examiner

*Primary Examiner* — Anthony Nguyen
(74) *Attorney, Agent, or Firm* — Harness, Dickey & Pierce, P.L.C.

(57) ABSTRACT

According to example embodiments, a roll printing apparatus includes a cleaning device in which a cleaning nozzle unit and a spray nozzle unit are integrated so that both a reverse offset process and a cliche cleaning process may be achieved in the roll printing apparatus. The roll printing apparatus may include a base plate, a blanket roll to transfer an ink material to a cliche and a substrate, a blanket roll supporter located on the base plate to support the blanket roll, a cliche table located on the base plate to fix and move the cliche, a substrate table located on the base plate to fix the substrate, and the cleaning device installed on the base plate to clean the cliche. The cleaning device may include a cleaning nozzle unit to spray a cleaning solution and a spray nozzle unit to spray DIW, which are integrated.

23 Claims, 10 Drawing Sheets

ROLL PRINTING APPARATUS

CROSS-REFERENCE TO RELATED APPLICATION

This application claims priority under 35 U.S.C. §119 to the benefit of Korean Patent Application No. 2010-0117423, filed on Nov. 24, 2010 in the Korean Intellectual Property Office, the contents of which is incorporated herein in its entirety by reference.

BACKGROUND

1. Field

Example embodiments relate to a roll printing apparatus including a cleaning device.

2. Description of the Related Art

Attention is focused on printing processes, such as printed electronics technology, as an alternative and/or replacement for some conventional lithography processes used in industries such as semiconductors and LCDs. Printing processes may simplify a process compared to a conventional lithography processes, thereby reducing production time and production costs.

Through printing processes, such as printed electronics technology, desired patterns may be printed on various electronic elements, such as electronic circuits, sensors, solar cells, flexible displays and RFIDs, using various materials.

Further, printing processes such as printed electronics technology may use substrates made of various materials, such as plastic, fiber and paper. Thus, the range of applications for printed electronics technology is good.

Printing processes may include reverse offset printing. Reverse offset printing may utilize an ink having a low viscosity for printing desired patterns on thin film transistors (TFTs), color filters (C/Fs) and so on. Reverse offset printing may use a cliche to transfer the ink, and the cliche may be cleaned and reused after printing. Residual ink and/or foreign substances on the cliche may influence pattern quality in subsequent processes. The cliche may be cleaned so that foreign substances and/or cleaning solution does not remain on the cliche.

SUMMARY

Example embodiments relate to a roll printing apparatus including a cleaning device.

According to example embodiments, a roll printing apparatus is configured to perform a reverse offset printing process and a cliche cleaning process.

According to example embodiments, roll printing apparatus includes a cleaning device in which a cleaning nozzle unit and a spray nozzle unit are integrated into a single cleaning device.

According to example embodiments, a roll printing apparatus includes a base plate, a blanket roll configured to transfer an ink material to a cliche and a substrate, a blanket roll supporter on the base plate to support the blanket roll, a cliche table on the base plate to fix and move the cliche, a substrate table on the base plate to fix the substrate, and a cleaning device on the base plate. The cleaning device may include a cleaning nozzle unit to spray a cleaning solution and a spray nozzle unit to spray a rinsing fluid. The cleaning nozzle unit and the spray nozzle unit may be integrated.

The roll printing apparatus may further include an ink transfer device to transfer the ink material to the blanket roll.

The cliche table may include a chuck plate to fix the cliche. The cliche table may also include a cliche table drive unit to move the cliche table.

The cliche table may include a waste suction bar to limit waste generated by cleaning the cliche from flowing off of the chuck plate.

The cliche table may further include a waste discharge unit to discharge waste to the outside of the cleaning device.

The roll printing apparatus may device further include a waste reservoir to store at least one of waste from the waste suction bar and waste discharged by the waste discharge unit.

According to example embodiments, a roll printing apparatus may include a base plate, a cliche table on the base plate to fix and move a cliche, a blanket roll on the base plate, and a cleaning device. The cleaning device may include a cleaning chamber to clean the cliche, a chamber holder to fix the cleaning chamber, a chamber supporter configured to vertically move the chamber holder, a cleaning nozzle unit, a spray nozzle unit, and a nozzle supporter rotatably installed on the chamber holder to fix the cleaning nozzle unit and the spray nozzle unit. The cleaning nozzle unit may include a cleaning solution spray nozzle to spray a cleaning solution, a waste inlet to remove waste generated during cleaning of the cliche, and an air blower to dry the cliche. The spray nozzle unit may include a spray nozzle to spray a rinsing fluid during cleaning of the cliche, a suction inlet to remove the waste generated during cleaning of the cliche, and an air blower to dry the cliche.

Exhaust ports may be on at least one of the cleaning chamber and the chamber holder.

The cliche table may include a chuck plate to fix the cliche. The cliche table may include a cliche table drive unit to move the cliche table.

The cliche table may include a waste suction bar at a periphery of the chuck plate to limit waste generated during the cleaning of the cliche from flowing off of the chuck plate.

The cliche table may further include a waste discharge unit to discharge the waste to the outside of the cleaning device.

The roll printing apparatus may further include a waste reservoir to store at least one of the waste passed through the waste inlet of the cleaning nozzle unit, the waste passed through the suction inlet of the spray nozzle unit, the waste passed by the waste suction bar, and the waste discharged by the waste discharge unit.

The cliche table drive unit may be configured to move the cliche fixed on the cliche table to the cleaning device in order to clean the cliche.

The cleaning chamber may include a viewing window.

The cleaning chamber may include a cleaning chamber cover at a lower end of the cleaning chamber.

The cleaning chamber cover may have a slidable form. The cleaning chamber cover may be configured to open when the cliche table is moved to the cleaning device. The cleaning chamber may be configured to close when cleaning of the cliche fixed to the cliche table is completed.

The cleaning chamber cover may have a foldable form. The cleaning chamber cover may be configured to open when the cliche table is moved to be put into the cleaning device. The cleaning chamber may be configured to close when cleaning of the cliche fixed to the cliche table is completed.

The chamber supporter may be configured to move the chamber holder down when the cliche table to which the cliche is fixed is moved to be put into the cleaning device. The chamber supporter may be configured to move the chamber holder upwards when cleaning of the cliche fixed to the cliche table is completed.

The cleaning nozzle and the spray nozzle may be integrated.

The nozzle supporter may be rotatably installed on the chamber holder. The nozzle supporter may be fixed to the cleaning nozzle unit and the spray nozzle unit. The nozzle supporter may be configured to rotate in order to adjust a cleaning direction of the cleaning nozzle unit and the spray nozzle unit.

The nozzle supporter may be configured to vertically move the cleaning nozzle unit and the spray nozzle unit in order to adjust an interval between the cliche and the cleaning unit and the spray nozzle unit.

The nozzle supporter may be rectilinearly movably installed on the chamber holder. The nozzle supporter may be configured to rectilinearly move the cleaning nozzle unit and the spray nozzle unit.

BRIEF DESCRIPTION OF THE DRAWINGS

These and/or other aspects of example embodiments will become apparent and more readily appreciated from the following description of the non-limiting embodiments, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Figure 1:
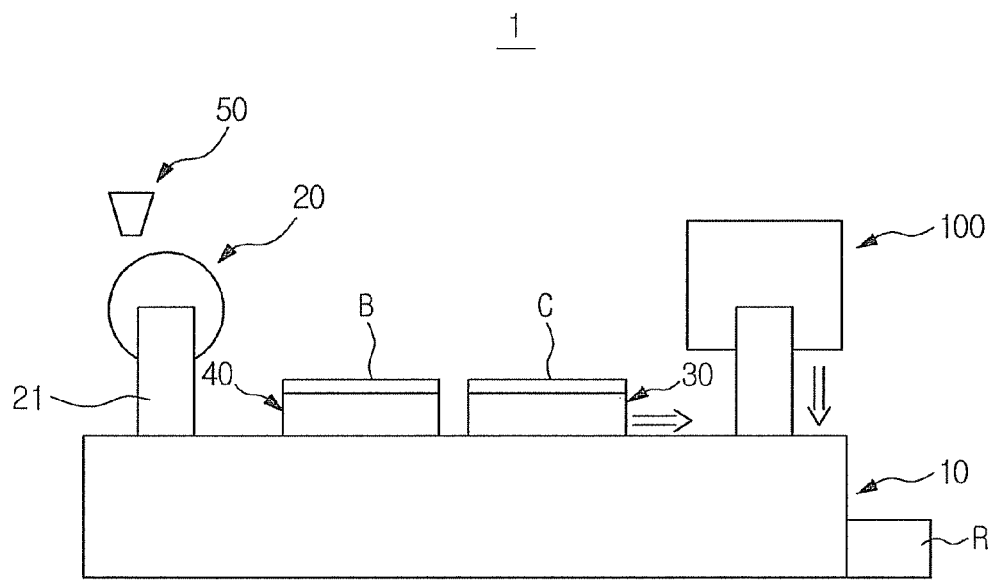
FIG. 1 is a view schematically illustrating a roll printing apparatus in accordance with example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
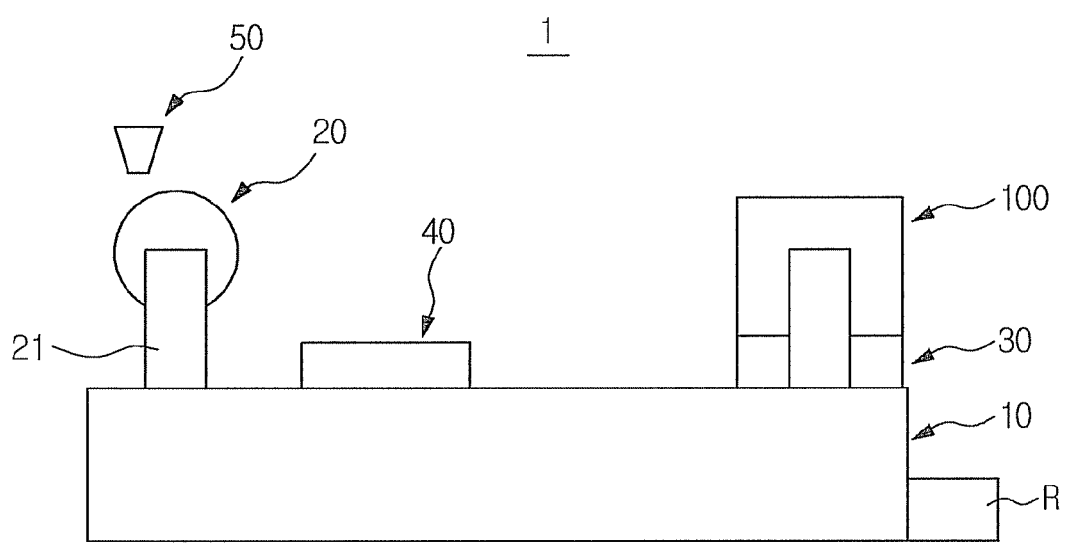
FIG. 2 is a view schematically illustrating a movement of a cliche table to a cleaning device in a roll printing apparatus in accordance with example embodiments.
Figure 3:
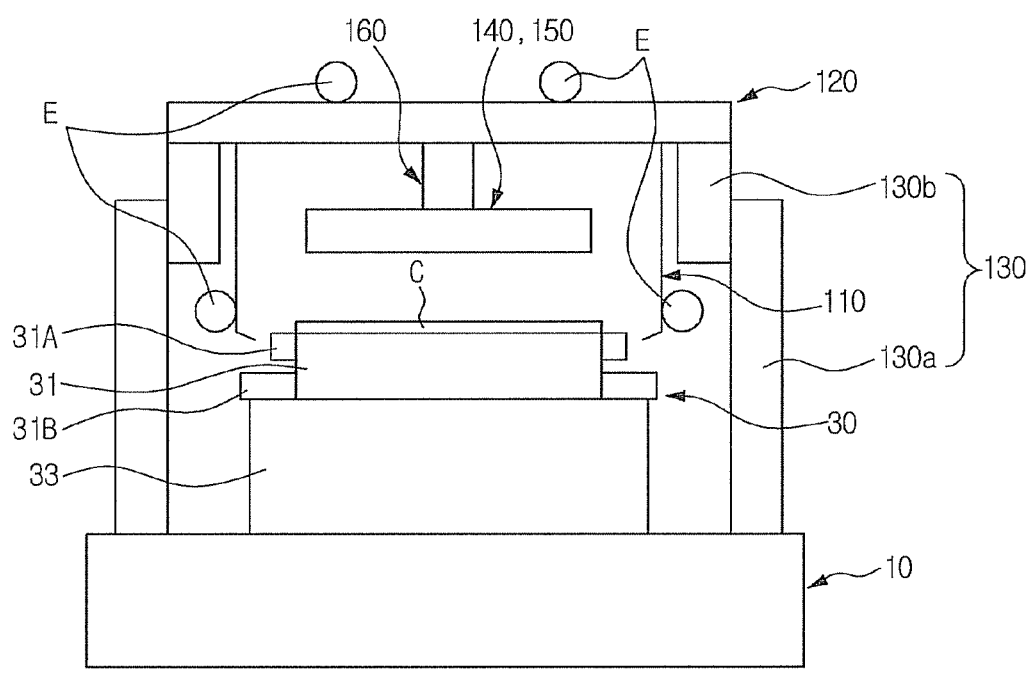
FIG. 3 is a view schematically illustrating the cleaning device of the roll printing apparatus in accordance with the example embodiments.
Figure 4:
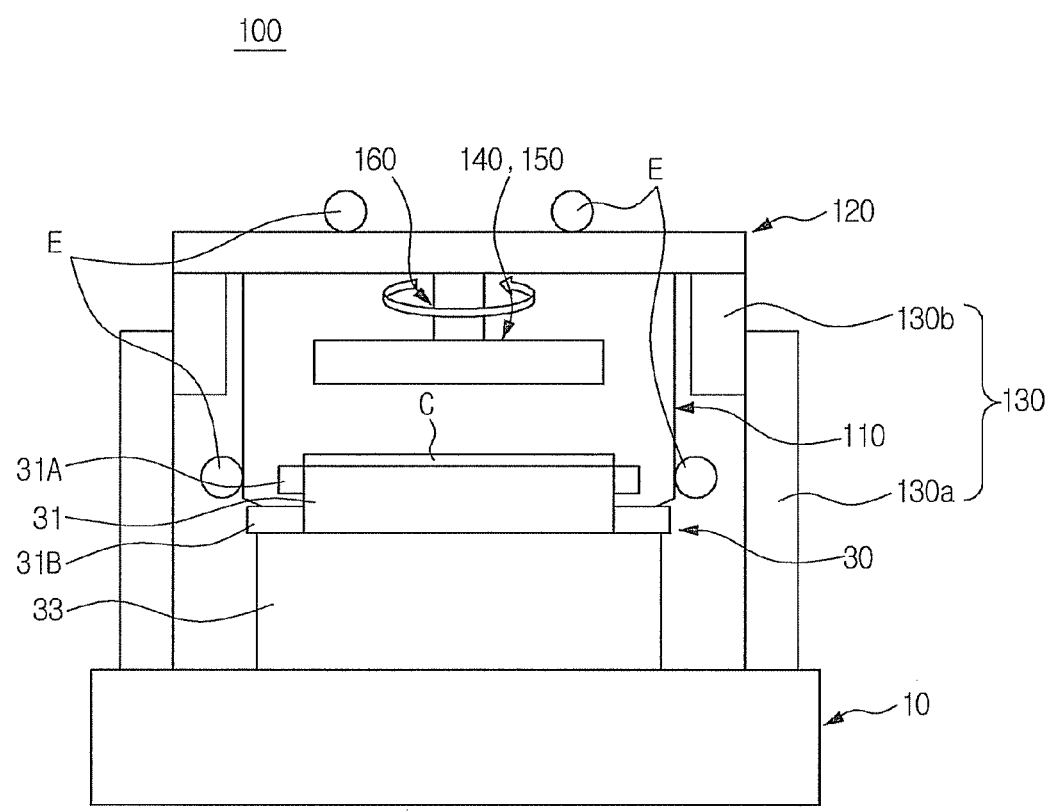
FIG. 4 is a view schematically illustrating a rotation of a nozzle supporter of the cleaning device and a waste discharge unit in a roll printing apparatus in accordance with the example embodiments.
Figure 5:
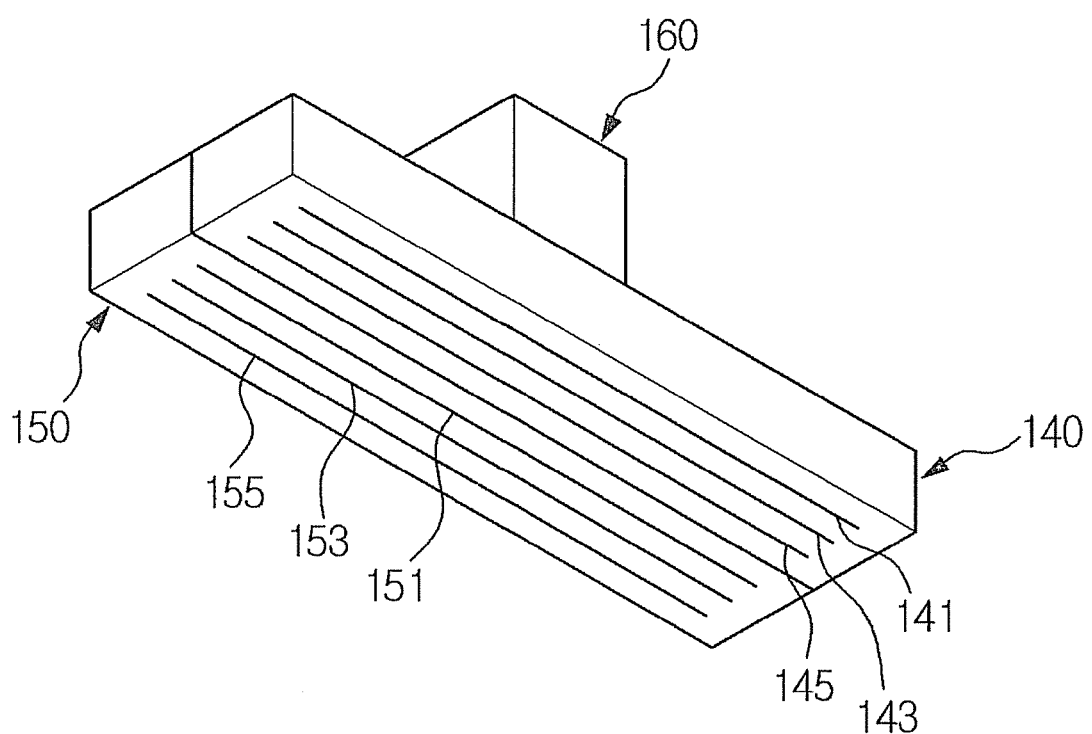
FIG. 5 is a view schematically illustrating integration of a cleaning nozzle unit and a spray nozzle unit of the cleaning device into one device and fixing of the integrated cleaning nozzle unit and spray nozzle unit to the nozzle supporter in the roll printing apparatus in accordance with example embodiments.
Figure 6:
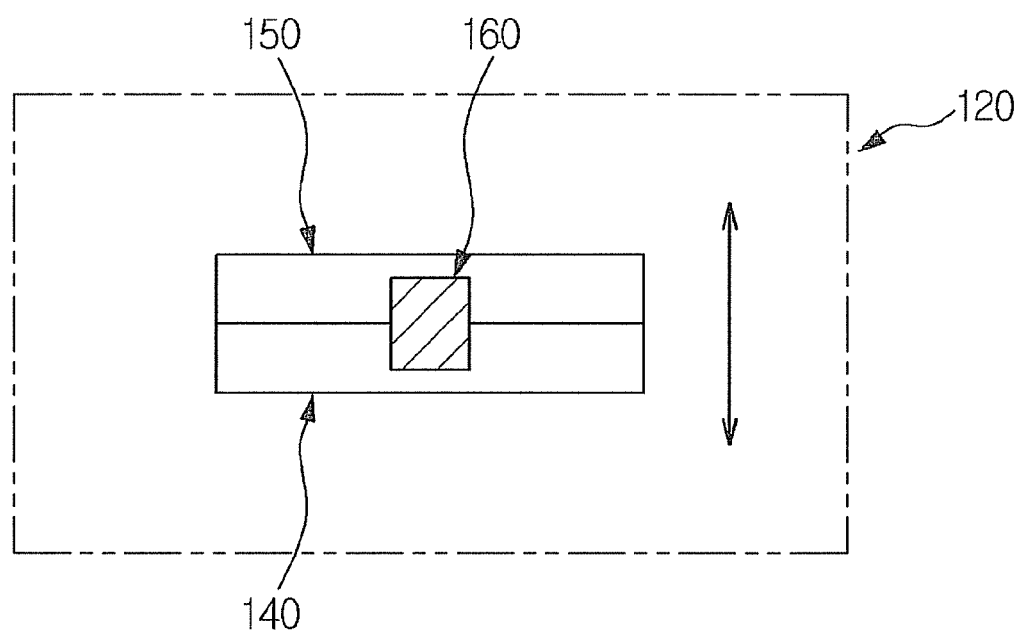
FIG. 6 is a view schematically illustrating rectilinear movement of the nozzle supporter of the cleaning device in the forward and backward directions under the condition that the nozzle supporter fixes the cleaning nozzle unit and the spray nozzle unit in the roll printing apparatus in accordance with example embodiments.
Figure 7:
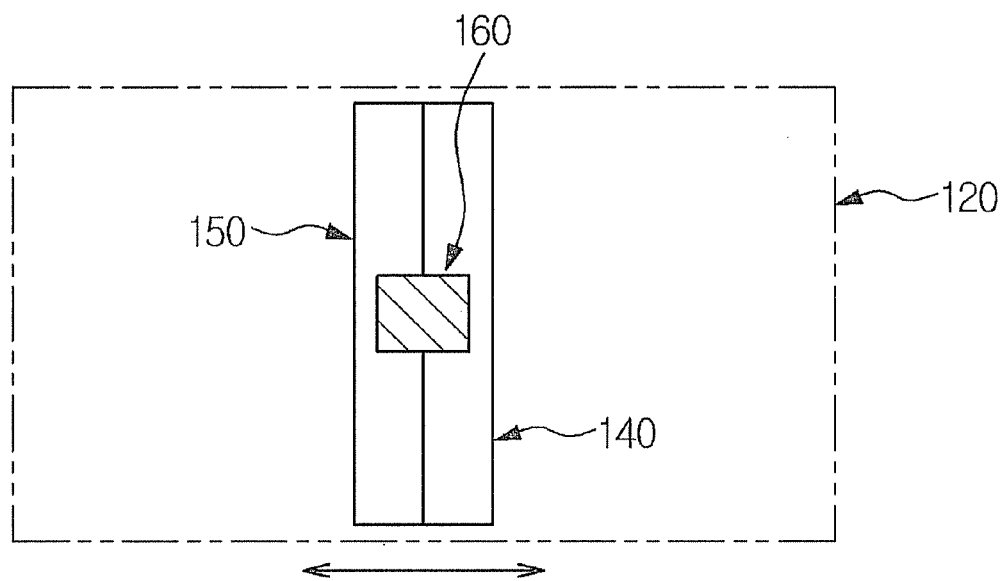
FIG. 7 is a view schematically illustrating rectilinear movement of the nozzle supporter of the cleaning device in the leftward and rightward directions under the condition that the nozzle supporter fixes the cleaning nozzle unit and the spray nozzle unit in the roll printing apparatus in accordance with example embodiments.
Figure 8:
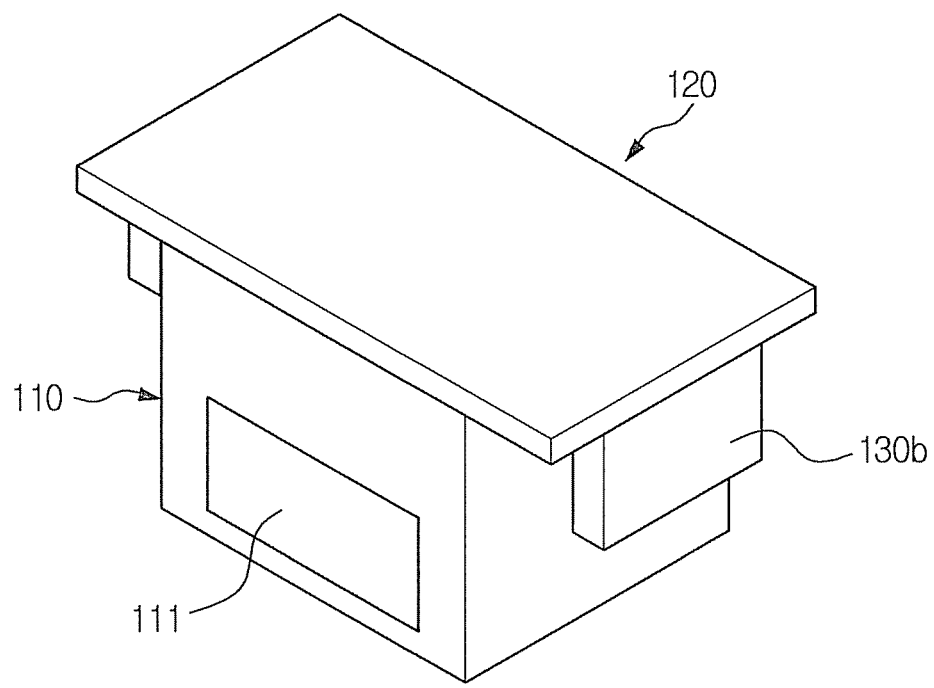
FIG. 8 illustrates a viewing window on the cleaning chamber of the cleaning device in the roll printing apparatus in accordance with example embodiments.
Figure 9:
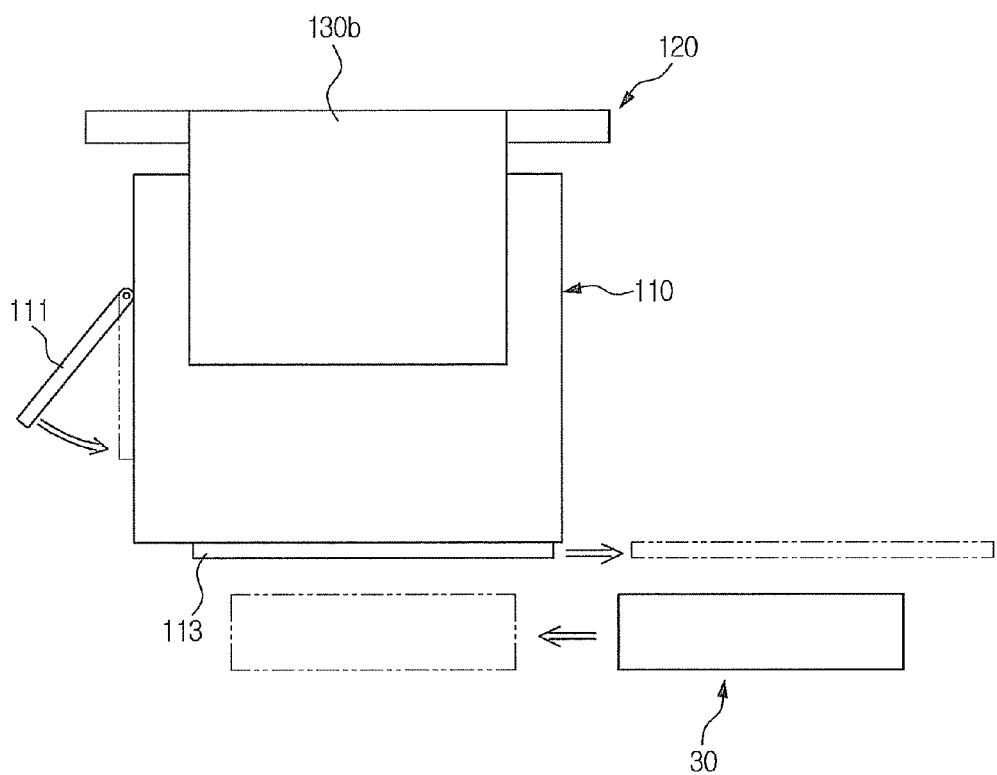
FIG. 9 is a side view schematically illustrating a viewing window and a slidable cleaning chamber cover on the cleaning chamber of the cleaning device in the roll printing apparatus in accordance with example embodiments.
Figure 10:
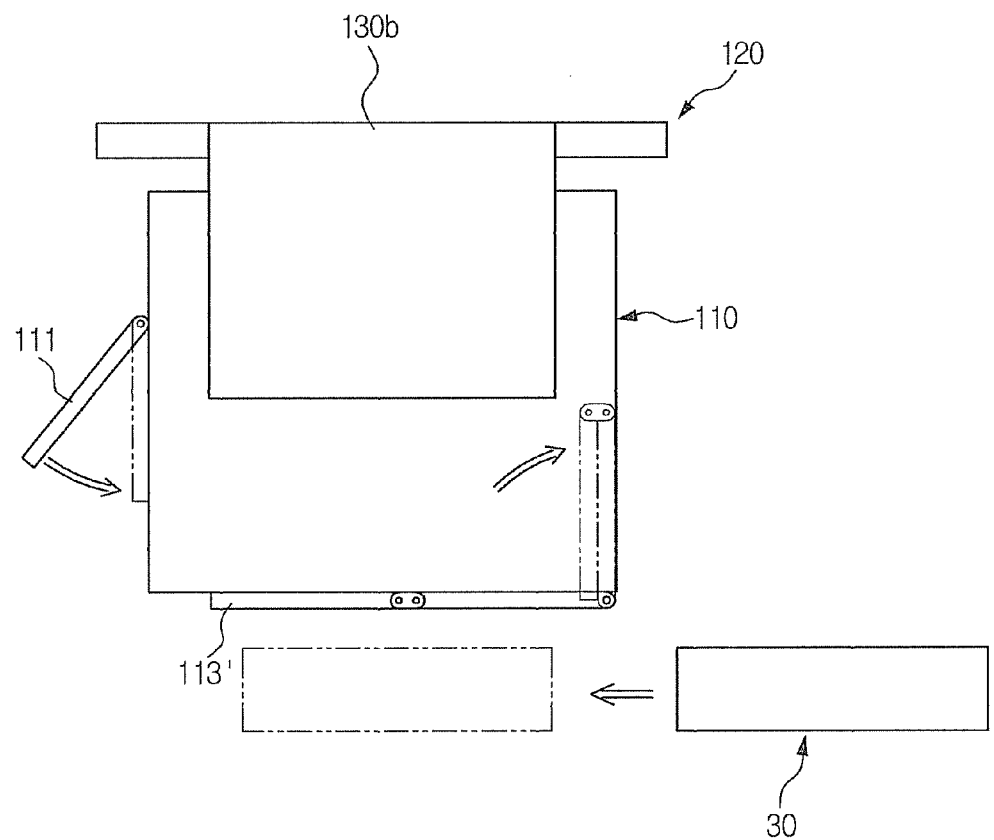
FIG. 10 is a side view schematically illustrating a viewing window and a foldable cleaning chamber cover on the cleaning chamber of the cleaning device in the roll printing apparatus in accordance with example embodiments.

FIGS. 1 and 2 are views schematically illustrating a roll printing apparatus in accordance with example embodiments, FIGS. 3 and 4 are views schematically illustrating the introduction of a cliche table into a cleaning device of the roll printing apparatus in accordance with example embodiments, FIG. 5 is a perspective view schematically illustrating a cleaning nozzle unit, a Spray nozzle unit and a nozzle supporter of the cleaning device of the roll printing apparatus in accordance with example embodiments, FIGS. 6 and 7 are views schematically illustrating rectilinear movement of the nozzle supporter of the cleaning device of the roll printing apparatus in accordance with example embodiments, FIG. 8 is a perspective view schematically illustrating installation of a viewing window on the cleaning chamber of the cleaning device of the roll printing apparatus in accordance with example embodiments, FIGS. 9 and 10 are side views schematically illustrating installation of the viewing window and a cleaning chamber cover on the cleaning chamber of the cleaning device of the roll printing apparatus in accordance with example embodiments, respectively.

As shown in FIGS. 1 and 2, a roll printing apparatus 1 in accordance with example embodiments includes a base plate 10, a blanket roll 20 that is configured to be coated with an ink material to transfer the ink material to a cliche C and a substrate B, a blanket roll supporter 21 located on the base plate 10 to support the blanket roll 20, a cliche table 30 located on the base plate 10 to fix and move the cliche C, a substrate table 40 located on the base plate 10 to fix the substrate B, an ink transfer device 50 to transfer ink material to the blanket roll 20, and a cleaning device 100 installed on the base plate 10 to clean the cliche C fixed to the cliche table 30. The ink transfer device 50 may be a coating device that is configured to uniformly (and/or substantially uniformly) coat the blanket roll 20 with ink material, but example embodiments are not limited thereto.

As shown in FIGS. 1 and 2, the blanket roll 20 is supported by the blanket roll supporter 21 located on the upper surface of the base plate 10.

The blanket roll supporter 21 is installed on the base plate 10. The blanket roll supporter 21 is configured to be rectilinearly movable. When the blanket roll supporter 21 moves rectilinearly on the upper surface of the base plate 10, the blanket roll 20 moves rectilinearly with the blanket roll supporter 21 toward the cliche table 30, on which the cliche C may be fixed, and/or to the substrate table 40, on which the substrate B is fixed. Thus, ink material on the blanket roll 20 may be transferred to the cliche C and/or the substrate B.

The blanket roll 20 may be coated with the ink material. The ink material will be used to form a pattern on the substrate B.

The ink transfer device 50 may be configured to uniformly (and/or substantially uniformly) coat the blanket roll 20 with the ink material.

The ink material is transferred to the cliche C as a non-patterned shape, excluding the pattern to be formed on the substrate B.

The blanket roll 20, supported by the blanket roll supporter 21, may move to the cliche table 30 and transfer part of the ink material coating on the blanket roll 20 to the cliche C. After the blanket roll 20 transfers part of the ink material coating to the cliche C, the pattern to be formed on the substrate B remains on the blanket roll 20.

After transferring the ink material to the cliche C, the blanket roll 20 supported by the blanket roll supporter 21 moves to the substrate table 40, to which the substrate B is fixed, and then transfers the ink material pattern to the substrate B.

Through the above process, the pattern may be formed on the substrate B.

As shown in FIGS. 1 to 4, the cliche table 30 may be on the upper surface of the base plate 10, and the cliche C may be fixed to the upper surface of the cliche table 30.

In order to fix the cliche C to the cliche table 30, a chuck plate 31 may be installed on the upper surface of the cliche table 30, but example embodiments are not limited thereto.

The chuck plate 31 installed on the upper surface of the cliche table 30 may be configured to suck the cliche C in order to fix the cliche C to the cliche table 30, based on suction.

The ink material transferred from the blanket roll 20 remains on the cliche C fixed to the cliche table 30, and thus the cliche C may be cleaned in order to reuse the cliche C in subsequent processes.

In order to clean the cliche C, the cliche table 30 to which the cliche C is fixed is moved to the cleaning device 100 installed on the upper surface of the base plate 10 by a cliche table drive unit 33.

The cliche table 30 may include a waste suction bar 31A to limit and/or prevent waste generated when the cliche table 30 is put into the cleaning device 100 and the cliche C is cleaned from flowing off of the chuck plate 31. The waste suction bar 31A may be installed at the periphery of the chuck plate 31 on the upper surface of the cliche table 30. The waste generated when the cliche is cleaned may be organic waste, but example embodiments are not limited thereto. Alternatively, the waste may include inorganic waste.

Further, the cliche table 30 may include a waste discharge unit 31B to discharge the waste generated in the course of cleaning the cliche C in the cleaning device 100. For example, waste may be stuck to the walls of the cleaning chamber 110 and flows down along the wall of the cleaning chamber 110 of the cleaning device 100. The waste discharge unit 31B may be installed at the periphery of the chuck plate 31 installed on the upper surface of the cliche table 30.

A waste reservoir R (see FIG. 1) to store the waste passed and/or removed (e.g., sucked) by the waste suction bar 31A and/or the waste discharged through the waste discharge unit 31B may be installed on the roll printing apparatus 1.

After the cliche C fixed to the upper surface of the cliche table 30 is put into the cleaning device 100 and is cleaned, the cliche C may be reused in subsequent processes.

As shown in FIGS. 3 and 4, the cleaning device 100 includes the cleaning chamber 110, a chamber holder 120 to fix the cleaning chamber 110, a chamber supporter 130 to support the chamber holder 120 such that the chamber holder 120 is vertically movable, a cleaning nozzle unit 140 to spray a cleaning solution, a spray nozzle unit 150 to spray a rinsing fluid such as de-ionized water (DIW), and a nozzle supporter 160 rotatably installed on the chamber holder 120 to fix the cleaning nozzle unit 140 and the spray nozzle unit 150. The chamber supporter 130 may include a first chamber supporter piece 130a and a second chamber supporter piece 130b, but example embodiments are not limited thereto and the chamber supporter 130 may include more or fewer pieces. Further, while the FIGS. 3 and 4 illustrate a spray nozzle unit 150 may be used to spray de-ionized water (DIW), example embodiments are not limited thereto.

As shown in FIGS. 3 and 4, the cleaning chamber 110 serves to limit and/or prevent the waste generated in the course of cleaning the cliche C from leaking to the outside, thereby allowing the cleaning process to be carried out inside of the cleaning chamber 110.

Exhaust ports E to exhaust gas generated in the course of cleaning the cliche C may be installed on the cleaning chamber 110.

As shown in FIG. 8, a viewing window 111, through which a worker may observe a cleaning state of the cliche C, may be installed on the wall of the cleaning chamber 110.

When cleaning the cliche C, the worker may open and/or look through the viewing window 111 to observe the cleaning state of the cliche C.

Further, as shown in FIGS. 9 and 10, a cleaning chamber cover 113, 113' to limit and/or prevent waste and foreign substances remaining in the cleaning chamber 110 and the cleaning solution on the cleaning nozzle unit 140 from dropping toward the base plate 10 is installed at the lower end of the cleaning chamber 110.

As shown in FIG. 9, the cleaning chamber cover 113 installed at the lower end of the cleaning chamber 110 may have a slidable form. The cleaning chamber cover 113 may be opened when the cliche table 30 to which the cliche C is fixed is put into the cleaning device 100. The cleaning chamber cover 113 may limit and/or prevents waste and foreign substances remaining in the cleaning chamber 110 and the cleaning solution on the cleaning nozzle unit 140 from dropping toward the base plate 10 when cleaning of the cliche C has been completed.

Alternatively, as shown in FIG. 10, the cleaning chamber cover 113' may have a foldable form and be installed at the lower end of the cleaning chamber 110.

As shown in FIGS. 3 to 4, the chamber holder 120 serves to fix the cleaning chamber 110, and is supported by the chamber supporter 130 installed on the upper surface of the base plate 10.

The nozzle supporter 160 is rotatably installed on the chamber holder 120, and a guide device (not shown) to guide the nozzle supporter 160 so as to perform rectilinear movement of the nozzle supporter 160 may be installed on the chamber holder 120.

As shown in FIGS. 3 and 4, the chamber supporter 130 installed on the upper surface of the base plate 10 supports the chamber holder 120 such that the chamber holder 120 is vertically movable.

When the cliche table 30, to which the cliche C is fixed, is introduced into the cleaning device 100, the chamber holder 120 is moved downwards by the chamber supporter 130 and thus the cleaning chamber 110 fixed to the chamber holder 120 covers the cliche C fixed to the cliche table 30 by the chuck plate 31 so that the cliche C may be cleaned.

When cleaning of the cliche C has been completed, the chamber holder 120 is moved upwards by the chamber supporter 130 and thus the cleaning chamber 110 is moved upwards together with the chamber holder 120 so that the cliche table 30, to which the cliche C is fixed, may be moved to the outside of the cleaning device 100.

As shown in FIG. 5, the cleaning nozzle unit 140 includes a cleaning solution spray nozzle 141 to spray the cleaning solution at a high pressure so as to clean the cliche C, a waste inlet 143 to remove (e.g., suck) the waste generated in the course of cleaning the cliche C, and an air blower 145 to blow air so as to dry the cliche C.

Further, the spray nozzle unit 150 includes a spray nozzle 151 to spray a rinsing fluid such as de-ionized water (DIW) at a high pressure so as to clean the cliche C, a waste inlet 153 to removed (e.g., suck) the waste generated in the course of cleaning the cliche C, and an air blower 155 to blow air so as to dry the cliche C. While the spray nozzle 151 may spray DIW, example embodiments are not limited thereto and other fluids may be sprayed by the spray nozzle 151.

The waste removed and/or sucked by the waste inlets 143 and 153 of the cleaning nozzle unit 140 and the spray nozzle unit 150 may be discharged to and stored in the waste reservoir R installed on the roll printing apparatus 1.

The cleaning nozzle unit 140 and the spray nozzle unit 150 may be integrated into a single device.

As shown in FIGS. 3 to 7, the nozzle supporter 160 is installed on the chamber holder 120 and fixes the integrated cleaning nozzle unit 140 and spray nozzle unit 150.

The nozzle supporter 160 is rotatably installed on the chamber holder 120, and thus when the nozzle supporter 160 is rotated in a cleaning direction, the cleaning nozzle unit 140 and the spray nozzle unit 150 fixed to the nozzle supporter 160 are rotated together with the rotation of the nozzle supporter 160, thereby adjusting the cleaning direction.

Further, the nozzle supporter 160 vertically moves the integrated cleaning nozzle unit 140 and spray nozzle unit 150, thereby adjusting an interval between the cleaning and spray nozzle units 140 and 150 and the cliche C.

The nozzle supporter 160 may be rotated so as to set the cleaning direction in which the cleaning nozzle unit 140 and the spray nozzle unit 150 clean the cliche C. The nozzle supporter 160 may be vertically moved so the cleaning nozzle unit 140 and the spray nozzle unit 150 are vertically moved to adjust the interval with the cliche C. The nozzle supporter 160 may rectilinearly move, thereby carrying out cleaning of the cliche C.

In order to achieve rectilinear movement of the nozzle supporter 160 so as to carry out cleaning of the cliche C, the nozzle supporter 160 is installed on the chamber holder 120 such that the nozzle supporter 160 may move rectilinearly.

The guide device (not shown) to guide rectilinear movement of the nozzle supporter 160 may be installed on the chamber holder 120.

Hereinafter, a process of cleaning the cliche C in the roll printing apparatus 1 will be described with reference to FIGS. 1 to 9.

First, when the ink material is transferred to the cliche C and the substrate B by the blanket roll 20 of the roll printing apparatus 1 shown in FIG. 1, a pattern is formed on the substrate B, and the cliche C fixed to the cliche table 30 is moved to the cleaning device 100, as shown in FIG. 2, so as to be cleaned for reuse.

Here, the cliche table 30 is moved to the cleaning device 100 by the cliche table drive unit 33 shown in FIGS. 3 and 4.

When the cliche table 30 is moved to the cleaning device 100, the cleaning device 100 shown in FIGS. 3 and 4 cleans the cliche C.

When the cliche table 30 is moved to the cleaning device 100 by the cliche table drive unit 33, as shown in FIGS. 2 to 4, the chamber holder 120 is moved downwards by the chamber supporter 130. When the chamber holder 120 is moved downwards, the cleaning chamber 110 fixed to the chamber holder 120 is moved downwards and may contact the waste discharge unit 31B installed on the chuck plate 31 of the cliche table 30.

Here, the cleaning chamber 110 is moved downwards under the condition that the cleaning chamber cover 113 installed at the lower end of the cleaning chamber 110 shown in FIG. 9 or 10 is opened.

As shown in FIG. 4, when the cleaning chamber 110 fixed to the chamber holder 120 is moved downwards and may contact the waste discharge unit 31B installed on the chuck plate 31 of the cliche table 30, the nozzle supporter 160 to which the integrated cleaning and spray nozzle units 140 and 150 are fixed may be rotated, thereby adjusting a cleaning direction.

When the nozzle supporter 160 is rotated so as to set the cleaning direction, the nozzle supporter 160 vertically moves the cleaning nozzle unit 140 and the spray nozzle unit 150, thereby adjusting an interval between the cleaning and spray nozzle units 140 and 150 and the cliche C.

As shown in FIGS. 6 and 7, the cleaning nozzle unit 140 and the spray nozzle unit 150 with the adjusted interval with the cliche C perform cleaning of the cliche C while rectilinearly moving in the forward and backward directions or in the leftward and rightward directions together with the nozzle supporter 160 under the condition that they are fixed to the nozzle supporter 160.

Cleaning of the cliche C may be carried out by spraying the cleaning solution to the cliche C at a high pressure through the cleaning solution spray nozzle 141 of the cleaning nozzle unit 140 shown in FIG. 5 and removing (e.g., sucking) waste, generated in the course of spraying the cleaning solution, by the waste inlet 143, simultaneously.

The waste passed through (and/or sucked by) the waste inlet 143 may be discharged to and stored in the waste reservoir R. Although FIG. 1 illustrates the waste reservoir R is to the right of the base plate 10, example embodiments are not limited thereto.

Further, cleaning of the cliche C may be carried out by spraying the rinsing fluid such as DIW to the cliche C at a high pressure through the spray nozzle 151 of the spray nozzle unit 150 shown in FIG. 5 and removing and/or sucking waste, generated in the course of spraying the rinsing fluid, by the waste inlet 153, simultaneously.

The waste passed and/or removed by the waste inlet 153 may be discharged to and stored in the waste reservoir R.

When cleaning of the cliche C is carried out through the cleaning nozzle unit 140 and the spray nozzle unit 150, some of the waste is not trapped by the waste inlet 143 and suction inlet 153 and then flows off of the cliche C or is stuck to the wall of the cleaning chamber 110.

In order to limit and/or prevent such a problem, as shown in FIGS. 3 and 4, the waste suction bar 31A is installed on the chuck plate 31 of the cliche table 30 so as to remove the waste flowing off of the cliche C, and the waste stuck to the wall of the cleaning chamber 110 flows down along the wall of the cleaning chamber 110 and is discharged through the waste discharge unit 31B installed on the chuck plate 31 of the cliche table 30.

The waste passed (e.g., removed and/or sucked) by the waste suction bar 31A and the waste discharged through the waste discharge unit 31B may be discharged to and stored in the waste reservoir R.

Such cleaning of the cliche C may be observed from the outside through the viewing window 111 installed on the cleaning chamber 110, as shown in FIGS. 8 to 10.

When cleaning of the cliche C has been completed, the nozzle supporter 160 to which the cleaning nozzle unit 140 and the spray nozzle unit 150 are fixed is returned to its original position, and when the nozzle supporter 160 is returned to its original position, the chamber holder 120 is moved upwards by the chamber supporter 130.

When the chamber holder 120 is moved upwards, the cleaning chamber 110 fixed to the chamber holder 120 is separated from the waste discharge unit 31B installed on the chuck plate 31 of the cliche table 30 and is then moved upwards.

When the cleaning chamber 110 is separated from the waste discharge unit 31B and moved upwards, the cliche table 30 is moved to the outside of the cleaning device 100 by the cliche table drive unit 33 for the preparation of subsequent processes.

When the cliche table 30 is moved to the outside of the cleaning device 100, in order to limit and/or prevent the waste and foreign substances remaining in the cleaning chamber 110 and the cleaning solution on the cleaning nozzle unit 140 and rinsing fluid from the spray nozzle unit 150 from dropping toward the base plate 10, the cleaning chamber cover 113 installed at the lower end of the cleaning chamber 110 may be closed.

Although FIG. 5 illustrates the roll printing apparatus 1 set to have a specific shape and direction with reference to the accompanying drawings, it would be appreciated by those skilled in the art that the shape and direction of the roll printing apparatus 1 may be changed and modified in various ways.

As is apparent from the above description, a roll printing apparatus in accordance with example embodiments may include a cleaning device, thereby allowing a cliche to be cleaned within the roll printing apparatus.

Further, cleaning of the cliche is carried out in the roll printing apparatus, thereby shortening process time and thus improving productivity and printing process efficiency.

Moreover, the cleaning device in the roll printing apparatus completely and/or thoroughly cleans the cliche.

Although some example embodiments have been particularly shown and described, it would be appreciated by those skilled in the art that changes such as variations in form and detail may be made therein without departing from the spirit and scope of claims.

What is claimed is:

1. A roll printing apparatus comprising:
   a base plate;
   a blanket roll configured to transfer an ink material to a cliche and a substrate;
   a blanket roll supporter on the base plate to support the blanket roll;
   a cliche table on the base plate, the cliche table configured to fix and move the cliche;
   a substrate table on the base plate, the substrate table configured to fix the substrate; and
   a cleaning device on the base plate to clean the cliche,
   the cleaning device including a nozzle supporter rotatably connected to the cleaning device,
   the nozzle supporter including a cleaning nozzle unit and a spray nozzle unit integrated by the nozzle supporter,
   at least one of the cleaning nozzle unit and the spray nozzle unit including at least one of a waste inlet and an air blower, the waste inlet for removing waste generated during cleaning of the cliche,
the air blower to dry the cliche,
the cleaning nozzle unit including a cleaning solution spray nozzle to spray a cleaning solution, and
the spray nozzle unit including a spray nozzle to spray a rinsing fluid.

2. The roll printing apparatus according to claim 1, further comprising:
an ink transfer device,
the ink transfer device configured to transfer the ink material to the blanket roll.

3. The roll printing apparatus according to claim 1, wherein the cliche table includes:
a chuck plate to fix the cliche, and
a cliche table drive unit to move the cliche table.

4. The roll printing apparatus according to claim 3, wherein the cliche table includes:
a waste suction bar at a periphery of the chuck plate to limit waste generated by cleaning the cliche from flowing off of the chuck plate.

5. The roll printing apparatus according to claim 4, wherein the cliche table further includes a waste discharge unit to discharge waste to the outside of the cleaning device.

6. The roll printing apparatus according to claim 5, further comprising:
a waste reservoir to store at least one of waste from the waste suction bar and waste discharged by the waste discharge unit.

7. A roll printing apparatus, comprising:
a base plate;
a cliche table on the base plate to fix and move a cliche;
a blanket roll on the base plate; and
a cleaning device including,
a cleaning chamber to clean the cliche,
a chamber holder to fix the cleaning chamber,
a chamber supporter on the base plate,
the chamber supporter configured to vertically move the chamber holder,
a cleaning nozzle unit including,
a cleaning solution spray nozzle to spray a cleaning solution,
a waste inlet to remove waste generated during cleaning of the cliche, and
an air blower part to dry the cliche,
a spray nozzle unit including,
a spray nozzle to spray a rinsing fluid during cleaning of the cliche,
a suction inlet to remove the waste generated during cleaning of the cliche, and
an air blower portion to dry the cliche, and
a nozzle supporter rotatably connected to the chamber holder to fix the cleaning nozzle unit and the spray nozzle unit.

8. The roll printing apparatus according to claim 7, further comprising:
exhaust ports on at least one of the cleaning chamber and the chamber holder.

9. The roll printing apparatus according to claim 7, wherein the cliche table includes:
a chuck plate to fix the cliche, and
a cliche table drive unit to move the cliche table.

10. The roll printing apparatus according to claim 9, wherein
the cliche table includes a waste suction bar at a periphery of the chuck plate to limit the waste generated during the cleaning the cliche from flowing off of the chuck plate.

11. The roll printing apparatus according to claim 10, wherein the cliche table further includes:
a waste discharge unit to discharge the waste to the outside of the cleaning device.

12. The roll printing apparatus according to claim 11, further comprising
a waste reservoir to store at least one of,
the waste passed through the waste inlet of the cleaning nozzle unit,
the waste passed through the suction inlet of the spray nozzle unit,
the waste passed by the waste suction bar, and
the waste discharged by the waste discharge unit.

13. The roll printing apparatus according to claim 11, wherein the cliche table drive unit is configured to move the cliche fixed on the cliche table to the cleaning device in order to clean the cliche.

14. The roll printing apparatus according to claim 7, wherein the cleaning chamber includes a viewing window.

15. The roll printing apparatus according to claim 14, wherein
the cleaning chamber includes a cleaning chamber cover at a lower end of the cleaning chamber.

16. The roll printing apparatus according to claim 15, wherein
the cleaning chamber cover has a slidable form,
the cleaning chamber cover is configured to open when the cliche table is moved to the cleaning device, and
the cleaning chamber cover is configured to close when cleaning of the cliche fixed to the cliche table is completed.

17. The roll printing apparatus according to claim 15, wherein
the cleaning chamber cover has a foldable form
the cleaning chamber cover is configured to open when the cliche table is moved to the cleaning device, and
the cleaning chamber cover is configured to close when cleaning of the cliche fixed to the cliche table is completed.

18. The roll printing apparatus according to claim 7, wherein
the chamber supporter is configured to move the chamber holder down when the cliche table to which the cliche is fixed is moved to be put into the cleaning device, and
the chamber supporter is configured to move the chamber holder upwards when cleaning of the cliche fixed to the cliche table is completed.

19. The roll printing apparatus according to claim 7, wherein the cleaning nozzle and the spray nozzle are integrated.

20. The roll printing apparatus according to claim 7, wherein
the nozzle supporter is rotatably connected to the chamber holder,
the nozzle supporter is fixed to the cleaning nozzle unit and the spray nozzle unit, and
the nozzle supporter is configured to rotate in order adjust a cleaning direction of the cleaning nozzle unit and the spray nozzle unit.

21. The roll printing apparatus according to claim 20, wherein
the nozzle supporter is configured to vertically move the cleaning nozzle unit and the spray nozzle unit in order to adjust an interval between the cliche and the cleaning nozzle unit and the spray nozzle unit.

22. The roll printing apparatus according to claim 21, wherein the nozzle supporter is rectilinearly movably installed on the chamber holder, and the nozzle supporter is configured to rectilinearly move the cleaning nozzle unit and the spray nozzle unit.

23. The roll printing apparatus according to claim 1, wherein the cleaning device includes a chamber holder, the nozzle unit is rotatably connected to the chamber holder, both the cleaning nozzle unit and the spray nozzle unit include the waste inlet and the air blower.

* * * * *